(12) United States Patent
Tanaka et al.

(10) Patent No.: US 12,160,949 B2
(45) Date of Patent: Dec. 3, 2024

(54) WIRING BOARD AND METHOD FOR MANUFACTURING WIRING BOARD

(71) Applicant: FUJIFILM Corporation, Tokyo (JP)

(72) Inventors: Genya Tanaka, Shizuoka (JP); Yasuyuki Sasada, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 187 days.

(21) Appl. No.: 17/824,868

(22) Filed: May 25, 2022

(65) Prior Publication Data

US 2022/0394842 A1  Dec. 8, 2022

(30) Foreign Application Priority Data

May 31, 2021 (JP) ................................ 2021-091556
Mar. 31, 2022 (JP) ................................ 2022-060653

(51) Int. Cl.
*H05K 1/02* (2006.01)
*H05K 3/10* (2006.01)
*H05K 3/46* (2006.01)
*H05K 1/03* (2006.01)

(52) U.S. Cl.
CPC ........... *H05K 1/024* (2013.01); *H05K 1/0283* (2013.01); *H05K 1/0298* (2013.01); *H05K 3/101* (2013.01); *H05K 3/4652* (2013.01); *H05K 1/036* (2013.01); *H05K 2201/0129* (2013.01); *H05K 2201/0133* (2013.01); *H05K 2201/0141* (2013.01); *H05K 2203/1194* (2013.01)

(58) Field of Classification Search
CPC ...... H05K 1/024; H05K 1/0298; H05K 3/101; H05K 3/4652; H05K 2201/0129; H05K 2201/0133; H05K 2201/0141; H05K 2203/1194; H05K 1/0283; H05K 2201/0154; H05K 2203/1105; H05K 1/02; H05K 1/0271; H05K 1/036; H05K 1/11; H05K 3/00; H05K 3/0011; H05K 3/46; H05K 1/0313; H05K 3/4632
See application file for complete search history.

(56) References Cited

U.S. PATENT DOCUMENTS

| | | | |
|---|---|---|---|
| 10,492,306 B2 | 11/2019 | Takahashi et al. | |
| 10,844,175 B2* | 11/2020 | Suto | H05K 3/386 |
| 2005/0162835 A1* | 7/2005 | Kogure | H05K 3/0055 361/720 |
| 2016/0212845 A1* | 7/2016 | Nakashima | H05K 1/0326 |
| 2017/0325336 A1* | 11/2017 | Shibata | H05K 3/284 |
| 2019/0061320 A1* | 2/2019 | Ishikawa | B32B 27/286 |
| 2019/0123299 A1* | 4/2019 | Lee | H10K 77/10 |
| 2020/0017769 A1* | 1/2020 | Konno | B32B 27/285 |

(Continued)

FOREIGN PATENT DOCUMENTS

WO  2016072361  5/2016

OTHER PUBLICATIONS

MatWeb Material Property Data, Polyimide, Published Jan. 9, 2020 (Year: 2020).*

*Primary Examiner* — Steven T Sawyer
(74) *Attorney, Agent, or Firm* — JCIPRNET

(57) ABSTRACT

A wiring board, comprising: wiring patterns that are buried in the wiring board, in which a region positioned between wiring patterns disposed in an in-plane direction of the same plane has an elastic modulus at 140° C. equal to or less than 0.1 MPa, and a dielectric loss tangent is equal to or less than 0.006.

15 Claims, 1 Drawing Sheet

(56) References Cited

U.S. PATENT DOCUMENTS

| | | | |
|---|---|---|---|
| 2020/0344870 A1* | 10/2020 | Nishimura | H05K 3/38 |
| 2021/0163790 A1* | 6/2021 | Oba | C09J 127/16 |
| 2022/0041932 A1* | 2/2022 | Imamura | C09K 19/542 |
| 2022/0231347 A1* | 7/2022 | Yamada | H01M 10/4264 |

* cited by examiner

WIRING BOARD AND METHOD FOR MANUFACTURING WIRING BOARD

CROSS-REFERENCE TO RELATED APPLICATIONS

The present application claims priority under 35 U.S.C. § 119 to Japanese Patent Application No. 2021-091556 filed on May 31, 2021, and Japanese Patent Application No. 2022-060653 filed on Mar. 31, 2022. Each of the above application is hereby expressly incorporated by reference, in its entirety, into the present application.

BACKGROUND OF THE INVENTION

1. Field of the Invention

The present disclosure relates to a wiring board and a method for manufacturing a wiring board.

2. Description of the Related Art

In recent years, a frequency that is used in communication equipment tends to be extremely high. To suppress a transmission loss in a high frequency band, it has been required to decrease a specific dielectric constant and a dielectric loss tangent of an insulation material that is used in a circuit board.

For example, WO2016/072361A describes a circuit board that has a laminated structure having a plurality of thermoplastic liquid crystal polymer films and at least one conductor layer, and in which a structure where the conductor layer subjected to circuit processing is interposed between two thermoplastic liquid crystal polymer films is included in at least a part of the laminated structure.

SUMMARY OF THE INVENTION

An object of an embodiment of the present invention is to provide a wiring board and a method for manufacturing a wiring board having excellent wiring followability and suppressed wiring distortion.

Means for attaining the above-described object includes the following aspects.

<1> A wiring board, comprising:
wiring patterns that are buried with the wiring board,
in which a region positioned between wiring patterns disposed in an in-plane direction of the same plane has an elastic modulus at 140° C. equal to or less than 0.1 MPa, and
a dielectric loss tangent is equal to or less than 0.006.

<2> The wiring board according to <1>, in which a thickness of the wiring pattern is 5 μm to 40 μm.

<3> The wiring board according to <1> or <2>, in which the region has an elastic modulus at 25° C. equal to or greater than 400 MPa.

<4> The wiring board according to any one of <1> to <3>, comprising a substrate, the wiring patterns disposed on at least one surface of the substrate, and a resin layer disposed between the wiring patterns and on the wiring patterns, in which the resin layer has a dielectric loss tangent equal to or less than 0.006.

<5> The wiring board according to <4>, in which the resin layer contains a thermoplastic polymer.

<6> The wiring board according to <5>, in which the thermoplastic polymer is a liquid crystal polymer.

<7> The wiring board according to <6>, in which the liquid crystal polymer has a constitutional unit represented by any of Formula (1) to Formula (3),

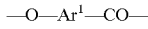  Formula (1)

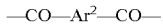  Formula (2)

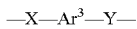  Formula (3)

in Formula (1) to Formula (3), $Ar^1$ represents a phenylene group, a naphthylene group, or a biphenylylene group, $Ar^2$ and $Ar^3$ each independently represent a phenylene group, a naphthylene group, a biphenylylene group, or a group represented by Formula (4), X and Y each independently represent an oxygen atom or an imino group, and at least one of hydrogen atoms in $Ar^1$ to $Ar^3$ may be each independently substituted with a halogen atom, an alkyl group, or an aryl group, and

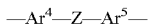  Formula (4)

in Formula (4), $Ar^4$ and $Ar^5$ each independently represent a phenylene group or a naphthylene group, and Z represents an oxygen atom, a sulfur atom, a carbonyl group, a sulfonyl group, or an alkylene group.

<8> The wiring board according to any one of <5> to <7>, in which the resin layer further contains a compound having a melting point lower than a melting point of the thermoplastic polymer.

<9> The wiring board according to <8>, in which the compound has a dielectric loss tangent equal to or less than 0.01.

<10> The wiring board according to <8> or <9>, in which a content of the compound is 15% by mass to 90% by mass with respect to a total amount of the resin layer.

<11> The wiring board according to any one of <4> to <10>, in which the resin layer includes a layer B disposed between the wiring patterns and on the wiring patterns, and a layer A disposed on the layer B, and
the layer B has an elastic modulus at 140° C. equal to or less than 0.1 MPa in a region positioned between the wiring patterns.

<12> The wiring board according to <11>, in which the layer A has an elastic modulus at 240° C. equal to or greater than 300 MPa.

<13> A method for manufacturing a wiring board, the method comprising superimposing a resin substrate on wiring patterns of a substrate with wiring patterns, and heating the substrate with wiring patterns and the resin substrate in a superimposed state to obtain a wiring board,
in which the resin substrate has an elastic modulus at a heating temperature in heating in the superimposed state equal to or less than 0.1 MPa in a region to a thickness position corresponding to a thickness of the wiring pattern with a surface on a side superimposed on the substrate with wiring patterns as a starting point, and a dielectric loss tangent of the wiring board is equal to or less than 0.006.

<14> The method for manufacturing a wiring board according to <13>, in which the resin substrate has an elastic modulus at 25° C. equal to or greater than 400 MPa in the region.

<15> The method for manufacturing a wiring board according to <13> or <14>, in which the resin substrate contains a thermoplastic polymer, and the heating temperature in heating in the superimposed state is a temperature lower than a melting point of the thermoplastic polymer.

<16> The method for manufacturing a wiring board according to <15>, in which the resin substrate further contains a compound having a melting point lower than the melting point of the thermoplastic polymer, and the heating temperature in heating in the superimposed state is a temperature higher than the melting point of the compound.

<17> The method for manufacturing a wiring board according to any one of <13> to <16>, in which the resin substrate includes a layer A, and a layer B provided on at least one surface of the layer A, the layer B has an elastic modulus at the heating temperature in heating in the superimposed state equal to or less than 0.1 MPa, and in superimposing the resin substrate, the resin substrate is superimposed such that a layer B side is in contact with the substrate with wiring patterns.

<18> The method for manufacturing a wiring board according to <17>, in which the layer A has an elastic modulus at the heating temperature in heating in the superimposed state equal to or greater than 300 MPa.

According to the embodiment of the present invention, a wiring board and a method for manufacturing a wiring board having excellent wiring followability and suppressed wiring distortion are provided.

DESCRIPTION OF THE PREFERRED EMBODIMENTS

Figure 1:
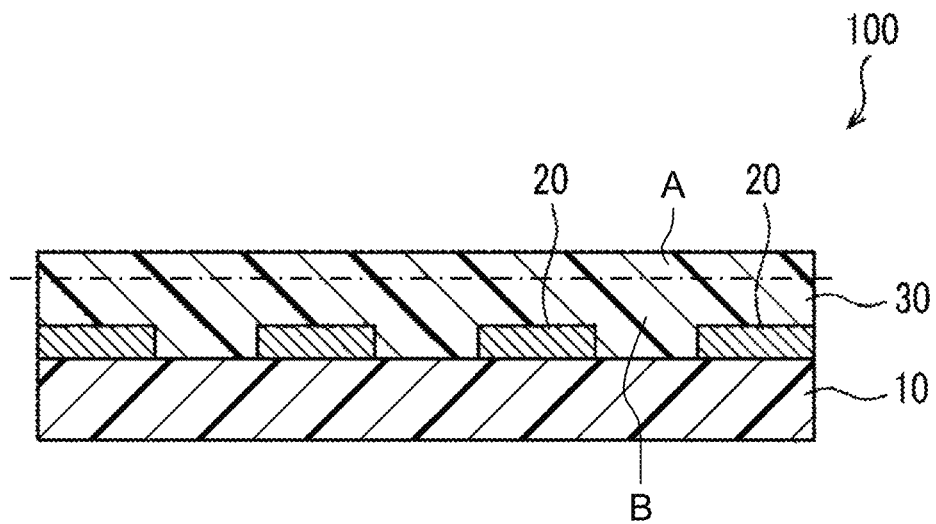
FIG. 1 is a schematic cross sectional view showing an example of a wiring board according to the present disclosure.

Hereinafter, the content of the present disclosure will be described in detail. The description of the constituent elements described below will be made based on a representative embodiment of the present disclosure, but the present disclosure is not limited to such an embodiment.

In the present specification, "to" indicating a numerical range is used in a meaning including numerical values described before and after "to" as a lower limit value and an upper limit value.

In numerical ranges described in stages in the present disclosure, an upper limit value and a lower limit value described in one numerical range may be replaced with an upper limit value and a lower limit value of another numerical range described in another stage. In the numerical ranges described in the present disclosure, an upper limit value and a lower limit value of the numerical ranges may be replaced with values shown in examples.

In a case where substitution or unsubstitution is not noted in regard to the notation of a group (atomic group) in the specification, the group includes not only a group having no substituent but also a group having a substituent. For example, "alkyl group" denotes not only an alkyl group (unsubstituted alkyl group) having no substituent but also an alkyl group (substituted alkyl group) having a substituent.

In the present specification, the concept of "(meth)acryl" includes both acryl and methacryl, and the concept of "(meth)acryloyl" includes both acryloyl and methacryloyl.

The term "step" in the present specification indicates not only an independent step but also a step that cannot be clearly distinguished from other steps as long as the intended purpose of the step is achieved.

In the present disclosure, "% by mass" and "% by weight" have the same meaning, and "parts by mass" and "parts by weight" have the same meaning.

In the present disclosure, a combination of two or more preferred aspects is a more preferred aspect.

A weight-average molecular weight (Mw) and a number-average molecular weight (Mn) in the present disclosure are molecular weights in terms of polystyrene used as a standard substance, which are detected by a solvent pentafluorophenol (PFP)/chloroform=1/2 (mass ratio) and a differential refractometer using gel permeation chromatography (GPC) analyzer using TSKgel SuperHM-H (product name manufactured by Tosoh Corporation) as a column, unless otherwise specified.

In the present disclosure, "wiring followability" means a property that a layer (specifically, a resin layer or a substrate) in contact with wiring patterns is easily deformed following the wiring patterns. Specifically, the wiring followability means a property that a gap hardly occurs between the resin layer or the substrate and the wiring patterns.

Wiring Board

A wiring board according to the present disclosure is a wiring board in which wiring patterns are buried, an elastic modulus at 140° C. of a region positioned between the wiring patterns disposed in an in-plane direction of the same plane is equal to or less than 0.1 MPa, and a dielectric loss tangent is equal to or less than 0.006.

The present inventors have conducted intensive studies and have found that the above-described configuration is made, whereby it is possible to provide a wiring board having excellent wiring followability and suppressed wiring distortion.

A detailed mechanism with which the above-described effect is obtained is unclear, but is presumed as follows.

In the wiring board according to the present disclosure, since the elastic modulus at 140° C. of the region between the wiring pattern and the wiring pattern disposed in the in-plane direction of the same plane is equal to or less than 0.1 MPa, it has been considered that the region positioned between the wiring patterns is easily deformed along the shape of the wiring patterns, and the wiring board has excellent wiring followability.

In contrast, WO2016/072361A has not focused on an elastic modulus at 140° C. of a region positioned between wiring patterns.

Hereinafter, the wiring board according to the present disclosure will be described in detail.

The wiring board according to the present disclosure has wiring patterns, and the wiring patterns are buried. The wiring pattern can be buried in the wiring board, for example, by the following method. First, a metal layer is formed on a substrate, and the metal layer is etched in a pattern shape. With this, a substrate (hereinafter, referred to as "substrate with wiring patterns") that has wiring patterns disposed on at least one surface is obtained. Next, the substrate with wiring patterns and another substrate are superimposed such that the wiring patterns in the substrate with wiring patterns are inside. After the substrate with wiring patterns and another substrate are superimposed, the substrates may be adhered or thermally welded. With this, the wiring board in which the wiring patterns are buried is obtained.

In the present disclosure, "wiring patterns are buried" means that at least a part of the wiring patterns is present inside the wiring board.

A material of the wiring patterns is not particularly limited, but is preferably metal, and is more preferably silver or copper.

In the wiring board according to the present disclosure, the elastic modulus at 140° C. of the region positioned between the wiring patterns disposed in the in-plane direction of the same plane is equal to or less than 0.1 MPa. The elastic modulus at 140° C. is equal to or less than 0.1 MPa, whereby excellent wiring followability is achieved.

In the wiring board according to the present disclosure, a material of a region other than the wiring patterns is not particularly limited as long as the wiring patterns are buried. A material of the region positioned between the wiring patterns disposed in the in-plane direction of the same plane is not particularly limited as long as the elastic modulus at 140° C. is equal to or less than 0.1 MPa.

In the present disclosure, the elastic modulus means an indentation elastic modulus (Err). The elastic modulus at 140° C. is an elastic modulus that is measured under an environment of 140° C.

The elastic modulus of the region positioned between the wiring patterns disposed in the in-plane direction of the same plane is measured by the following method.

First, the wiring board is cut with a microtome or the like to obtain a cross section, and a region positioned between wiring patterns disposed in an in-plane direction of the same plane is specified from an image obtained by observing near wiring with an optical microscope. Next, an elastic modulus in the specified region is measured as an indentation elastic modulus using a nanoindentation method. The indentation elastic modulus is measured using a micro hardness tester. For example, the indentation elastic modulus is measured by setting a heating stage having heaters above and below a sample (for example, an upper surface and a lower surface of the wiring board, such as the outside of a resin layer 60 and a resin layer 80 shown in FIG. 2) in a micro hardness tester (product name "DUH-W201", manufactured by Shimadzu Corporation), adjusting a heater temperature to a predetermined temperature, applying a load to the specified region at a loading rate of 0.28 mN/second with a Vickers indenter, maintaining a maximum load 10 mN for ten seconds, and then, performing unloading at a loading rate of 0.28 mN/second.

From a viewpoint of improving wiring followability and further suppressing wiring distortion, the region positioned between the wiring patterns disposed in the in-plane direction of the same plane has the elastic modulus at 140° C. preferably equal to or less than 0.1 MPa, and more preferably equal to or less than 0.08 MPa. A lower limit value of the elastic modulus is not particularly limited, and is, for example, 0.0001 MPa.

The region positioned between the wiring patterns disposed in the in-plane direction of the same plane has elastic modulus at 25° C. preferably equal to or greater than 400 MPa, and more preferably equal to or greater than 500 MPa. An upper limit value of the elastic modulus is not particularly limited, and is, for example, 9000 MPa.

The wiring board according to the present disclosure has a plurality of wiring patterns disposed in the in-plane direction of the same plane. Accordingly, "between wiring patterns" means between wiring patterns from the in-plane direction of the same plane (between two adjacent wiring patterns). Therefore, the elastic modulus of the region positioned between the wiring patterns disposed in the in-plane direction of the same plane means an elastic modulus between a plurality of wiring patterns disposed in the in-plane direction of the same plane (two adjacent wiring patterns) of the wiring board.

A thickness of the wiring pattern is not particularly limited, and is preferably 5 μm to 40 μm, and more preferably 5 μm to 35 μm.

The thickness of the wiring pattern is measured by cutting the wiring board with a microtome and observing with an optical microscope.

The dielectric loss tangent of the wiring board according to the present disclosure is equal to or less than 0.006, and is preferably greater than 0 and equal to or less than 0.003. Since the dielectric loss tangent is equal to or less than 0.006, it is possible to reduce a transmission loss.

In the present disclosure, the dielectric loss tangent is measured by the following method.

The dielectric loss tangent is measured by a resonance perturbation method at a frequency of 28 GHz. Specifically, a split cylinder resonator (manufactured by KANTO Electronic Application and Development Inc.) is connected to a network analyzer ("N5230A" manufactured by Keysight Technology Co., Ltd.), a test piece (width: 25 mm×length: 50 mm, 24° C.·50%·24 hours humidity control) is inserted into a cavity resonator, and a dielectric loss tangent is measured from change in resonance frequency before and after insertion using analysis software manufactured by KANTO Electronic Application and Development Inc.

In a case where the wiring board is configured with a plurality of layers, the dielectric loss tangent of the wiring board is calculated from a dielectric loss tangent and a thickness of each layer using the following expression.

Dielectric Loss Tangent of Wiring Board=Σ(Dielectric Loss Tangent of Each Layer×Thickness of Each Layer/Total Thickness of Layers)

It is preferable that the wiring board according to the present disclosure comprises a substrate, wiring patterns disposed on at least one surface of the substrate, and a resin layer disposed between the wiring patterns and on the wiring pattern.

FIG. 1 is a schematic cross sectional view showing an example of the wiring board according to the present disclosure. A wiring board 100 shown in FIG. 1 comprises a substrate 10, wiring patterns 20 disposed on one surface of the substrate 10, and a resin layer 30 disposed between the wiring patterns 20 and on the wiring pattern 20.

Figure 2:
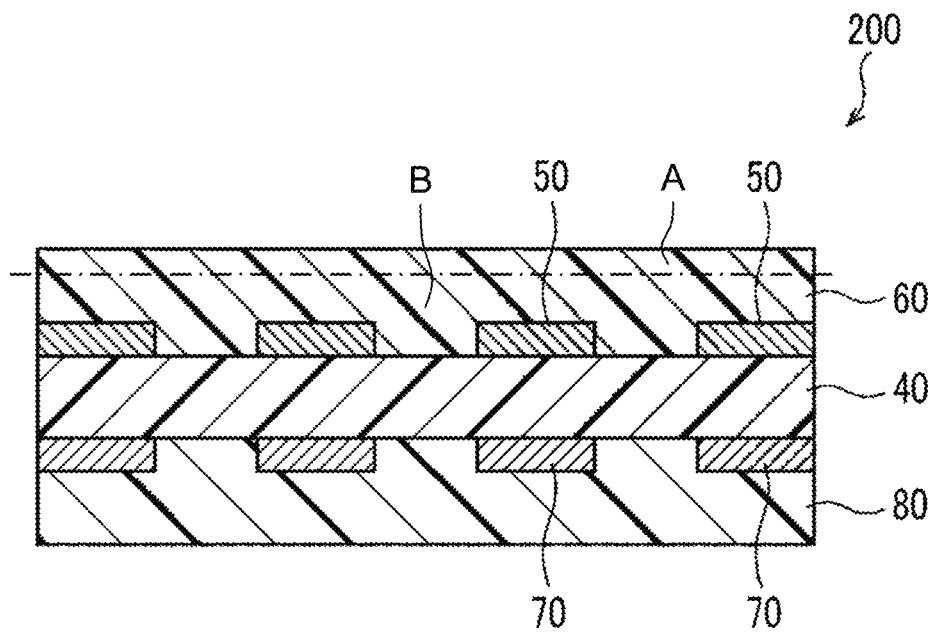
FIG. 2 is a schematic cross sectional view showing another example of a wiring board according to the present disclosure.

FIG. 2 is a schematic cross sectional view showing another example of the wiring board according to the present disclosure. A wiring board 200 shown in FIG. 2 comprises a substrate 40, wiring patterns 50 and 70 disposed on both surfaces of the substrate 40, a resin layer 60 disposed between the wiring patterns 50 and on the wiring patterns 50, and a resin layer 80 disposed between the wiring patterns 70 and on the wiring patterns 70.

In FIG. 1, a region positioned between the wiring patterns 20 is each region (a partial region of the resin layer 30) interposed between two adjacent wiring patterns 20. In FIG. 2, a region positioned between the wiring patterns 50 is each region (a partial region of the resin layer 60) interposed between two adjacent wiring patterns 50, and a region positioned between the wiring patterns 70 is each region (a partial region of the resin layer 80) interposed between two adjacent wiring patterns 70. In the present disclosure, as described above, the region positioned between the wiring patterns has the elastic modulus at 140° C. equal to or less than 0.1 MPa.

Resin Layer

The resin layer means a layer containing resin (that is, a polymer). Components other than resin may be contained in the resin layer. One kind of resin may be contained in the resin layer alone or two or more kinds of resin may be contained in the resin layer. The resin layer may be a layer in which resin is not a principal component as long as the resin layer contains resin. The principal component in the resin layer refers to a component having the greatest content among the components contained in the resin layer.

A dielectric loss tangent of the resin layer is preferably equal to or less than 0.006, and more preferably greater than 0 and equal to or less than 0.003.

Examples of resin contained in the resin layer include a thermoplastic polymer, such as a liquid crystal polymer, a fluorine-based polymer, a polymerized substance of a compound of cyclic aliphatic hydrocarbon and a group having an ethylenically unsaturated bond, polyether ether ketone, polyolefin, polyamide, polyester, polyphenylene sulfide, polyether ketone, polycarbonate, polyethersulfone, polyphenylene ether, a modified substance thereof, or polyether imide; an elastomer, such as a copolymer of glycidyl methacrylate and polyethylene; and a thermocurable polymer, such as phenol resin, epoxy resin, polyimide resin, or cyanate resin.

From a viewpoint of the dielectric loss tangent, the resin layer preferably contains a thermoplastic polymer among the substances, and the thermoplastic polymer is preferably a liquid crystal polymer.

In the present disclosure, the thermoplastic polymer means a polymer that is softened in a case of being heated to a melting point.

The liquid crystal polymer may be a thermotropic liquid crystal polymer that shows a liquid crystalline property in a molten state or may be a lyotropic liquid crystal polymer that shows a liquid crystalline property in a solution state. It is preferable that thermotropic liquid crystal is molten at a temperature equal to or lower than 450° C.

Examples of the liquid crystal polymer include liquid crystalline polyester, liquid crystalline polyester amide in which an amide bond is introduced into liquid crystalline polyester, liquid crystalline polyester ether in which an ether bond is introduced into liquid crystalline polyester, and liquid crystalline polyester carbonate in which a carbonate bond is introduced into liquid crystalline polyester.

From a viewpoint of the liquid crystalline property, the liquid crystal polymer is preferably a polymer having an aromatic ring, more preferably aromatic polyester or aromatic polyester amide, and still more preferably aromatic polyester amide.

The liquid crystal polymer may be a polymer in which a bond derived from an isocyanate, such as an imide bond, a carbodiimide bond, or an isocyanurate bond, is introduced into aromatic polyester or aromatic polyester amide.

It is preferable that the liquid crystal polymer is a fully aromatic liquid crystal polymer that uses an aromatic compound as a source monomer alone.

Examples of the liquid crystal polymer are described below.

1) Substance obtained by polycondensing (i) aromatic hydroxy carboxylic acid, (ii) aromatic dicarboxylic acid, (iii) at least one kind of compound selected from the group consisting of aromatic diol, aromatic hydroxyamine, and aromatic diamine.

2) Substance obtained by polycondensing a plurality of kinds of aromatic hydroxy carboxylic acid.

3) Substance obtained by polycondensing (i) aromatic dicarboxylic acid, and (ii) at least one kind of compound selected from the group consisting of aromatic diol, aromatic hydroxyamine, and aromatic diamine.

4) Substance obtained by polycondensing (i) polyester, such as polyethylene terephthalate, and (ii) aromatic hydroxy carboxylic acid.

Here, aromatic hydroxy carboxylic acid, aromatic dicarboxylic acid, aromatic diol, aromatic hydroxyamine, and aromatic diamine may be each independently partially or wholly changed to a polycondensable derivative thereof.

Examples of a polymerizable derivative of a compound having a carboxy group, such as aromatic hydroxy carboxylic acid or aromatic dicarboxylic acid, include a substance (ester) obtained by converting a carboxy group into an alkoxycarbonyl group or an aryloxycarbonyl group, a substance (acid halide) obtained by converting a carboxy group into a haloformyl group, and a substance (acid anhydride) obtained by converting a carboxy group into acyloxy carbonyl group.

Examples of a polymerizable derivative of a compound having a hydroxy group, such as aromatic hydroxy carboxylic acid, aromatic diol, or aromatic hydroxyamine, include a substance (acylated substance) obtained by acylating the hydroxy group to convert the hydroxy group into an acyloxy group.

Examples of a polymerizable derivative of a compound having an amino group, such as aromatic hydroxyamine or aromatic diamine, include a substance (acylated substance) obtained by acylating the amino group to convert the amino group into an acylamino group.

From a viewpoint of the liquid crystalline property, the liquid crystal polymer preferably has a constitutional unit (hereinafter, a constitutional unit represented by Formula (1), and the like are referred to as a unit (1) and the like) represented by any of Formula (1) to Formula (3) described below, more preferably has a constitutional unit represented by Formula (1) described below, and particularly preferably has a constitutional unit represented by Formula (1) described below, a constitutional unit represented by Formula (2) described below, and a constitutional unit represented by Formula (3) described below.

$$—O—Ar^1—CO— \quad \text{Formula (1)}$$

$$—CO—Ar^2—CO— \quad \text{Formula (2)}$$

$$—X—Ar^3—Y— \quad \text{Formula (3)}$$

in Formula (1) to Formula (3), $Ar^1$ represents a phenylene group, a naphthylene group, or a biphenylylene group, $Ar^2$ and $Ar^3$ each independently represent a phenylene group, a naphthylene group, a biphenylylene group, or a group represented by Formula (4), X and Y each independently represent an oxygen atom or an imino group, and at least one of hydrogen atoms in $Ar^1$ to $Ar^3$ may be each independently substituted with a halogen atom, an alkyl group, or an aryl group, and $$—Ar^4—Z—Ar^5— \quad \text{Formula (4)}$$

in Formula (4), $Ar^4$ and $Ar^5$ each independently represent a phenylene group or a naphthylene group, and Z represents an oxygen atom, a sulfur atom, a carbonyl group, a sulfonyl group, or an alkylene group.

Examples of the above-described halogen atom include a fluorine atom, a chlorine atom, a bromine atom, and an iodine atom.

Examples of the above-described alkyl group include a methyl group, an ethyl group, an n-propyl group, an isopropyl group, an n-butyl group, an isobutyl group, an s-butyl group, a t-butyl group, an n-hexyl group, a 2-ethylhexyl group, an n-octyl group, and an n-decyl group, and a carbon atom thereof is preferably 1 to 10.

Examples of the above-described aryl group include a phenyl group, an o-tolyl group, an m-tolyl group, a p-tolyl group, a 1-naphthyl group, and a 2-naphthyl group, and a carbon atom of the aryl group is preferably 6 to 20.

In a case where the above-described hydrogen atom is substituted with such groups, for each group represented by $Ar^1$, $Ar^2$, or $Ar^3$ independently, the number of groups is preferably equal to or less than two, and more preferably one.

Examples of the above-described alkylene group include a methylene group, a 1,1-ethanediyl group, 1-methyl-1,1-ethanediyl group, a 1,1-butanediyl group, and a 2-ethyl-1,1-hexanediyl group, and a carbon atom of the alkylene group is preferably 1 to 10.

The unit (1) is a constitutional unit derived from aromatic hydroxy carboxylic acid.

The unit (1) is preferably a unit where $Ar^1$ is a p-phenylene group (a constitutional unit derived from p-hydroxybenzoic acid) and a unit where $Ar^1$ is a 2,6-naphthylene group (a constitutional unit derived from 6-hydroxy-2-naphthoic acid) or a 4,4'-biphenylylene group (a constitutional unit derived from 4'-hydroxy-4-biphenylcarboxylic acid).

The unit (2) is a constitutional unit derived from aromatic dicarboxylic acid.

The unit (2) is preferably a unit where $Ar^2$ is a p-phenylene group (a constitutional unit derived from terephthalic acid), a unit where $Ar^2$ is an m-phenylene group (a constitutional unit derived from isophthalic acid), a unit where $Ar^2$ is a 2,6-naphthylene group (a constitutional unit derived from 2,6-naphthalenedicarboxylic acid), or a unit where $Ar^2$ is a diphenyl ether-4,4'-diyl group (a constitutional unit derived from diphenyl ether-4,4'-dicarboxylic acid).

The unit (3) is a constitutional unit derived from aromatic diol, aromatic hydroxylamine, or aromatic diamine.

The unit (3) is preferably a unit where $Ar^3$ is a p-phenylene group (a constitutional unit derived from hydroquinone, p-aminophenol, or p-phenylenediamine), a unit where $Ar^3$ is an m-phenylene group (a constitutional unit derived from isophthalic acid), or a unit where $Ar^3$ is a 4,4'-biphenylylene group (a constitutional unit derived from 4,4'-dihydroxybiphenyl, 4-amino-4'-hydroxybiphenyl, or 4,4'-diaminobiphenyl).

The content of the unit (1) is preferably equal to or greater than 30% by mol, more preferably 30% by mol to 80% by mol, still more preferably 30% by mol to 60% by mol, and particularly preferably 30% by mol to 40% by mol, with respect to the total amount of all constitutional units (a value obtained by dividing a mass of each constitutional unit constituting the liquid crystal polymer by a formula weight of the unit to obtain a substance equivalent (mol) of each unit and totalizing the obtained substance equivalents; the same applies to the following).

The content of the unit (2) is preferably equal to or less than 35% by mol, more preferably 10% by mol to 35% by mol, still more preferably 20% by mol to 35% by mol, and particularly preferably 30% by mol to 35% by mol, with respect to the total amount of all constitutional units.

The content of the unit (3) is preferably equal to or less than 35% by mol, more preferably 10% by mol to 35% by mol, still more preferably 20% by mol to 35% by mol, and particularly preferably 30% by mol to 35% by mol, with respect to the total amount of all constitutional units.

Although the greater the content of the unit (1), the more easily heat resistance, strength, and rigidity are improved, the content of the unit (1) is too large, solubility to a solvent is readily lowered.

A proportion of the content of the unit (2) and the content of the unit (3) is represented by [Content of Unit (2)]/[Content of Unit (3)] (mol/mol), and is preferably 0.9/1 to 1/0.9, more preferably 0.95/1 to 1/0.95, and still more preferably 0.98/1 to 1/0.98.

The liquid crystal polymer may have two kinds or more of the unit (1) to the unit (3) independently. Although the liquid crystal polymer may have constitutional units other than the unit (1) to the unit (3), the contents of other constitutional units are preferably equal to or less than 10% by mol, and more preferably equal to or less than 5% by mol, with respect to the total amount of all units.

The liquid crystal polymer preferably has, as the unit (3), a unit where at least one of X or Y is an imino group, that is, has a constitutional unit derived from aromatic hydroxylamine and a constitutional unit derived from aromatic diamine because of excellent solubility to a solvent, and more preferably has, as the unit (3), a unit where at least one of X or Y is an imino group, alone.

It is preferable that the liquid crystal polymer is produced by subjecting a source monomer corresponding to the constitutional unit constituting the liquid crystal polymer to melt polymerization. The melt polymerization may be performed in the presence of a catalyst. Examples of the catalyst include a metal compound, such as magnesium acetate, stannous acetate, tetrabutyltitanate, lead acetate, sodium acetate, potassium acetate, or antimony trioxide, and a nitrogen-containing heterocyclic compound, such as 4-(dimethylamino)pyridine,1-methylimidazole, and the nitrogen-containing heterocyclic compound is preferably used. In the melt polymerization, solid phase polymerization may be further performed as needed.

A flow beginning temperature of the liquid crystal polymer is preferably equal to or higher than 250° C., more preferably equal to or higher than 250° C. and equal to or lower than 350° C., and still more preferably equal to or higher than 260° C. and equal to or lower than 330° C. In a case where the flow beginning temperature of the liquid crystal polymer is within the above-described range, solubility, heat resistance, strength, and rigidity are excellent, and viscosity of a solution is moderate.

The flow beginning temperature is also referred to as a flow temperature or a temperature for flowing, and is a temperature at which viscosity of 4,800 Pa·s (48,000 poise) is shown when the liquid crystal polymer is melted and extruded from a nozzle having an inner diameter of 1 mm and a length of 10 mm using a capillary rheometer while increasing a temperature at a rate of 4° C./minute under a load of 9.8 MPa (100 kg/cm$^2$), and that is a measure of a molecular weight of the liquid crystal polymer (see "Liquid Crystal Polymer,—Synthesis/Molding/Application—", edited by Naoyuki Koide, CMC Co., Ltd., Jun. 5, 1987, p. 95).

The weight-average molecular weight of the liquid crystal polymer is preferably equal to or less than 1,000,000, more preferably 3,000 to 300,000, still more preferably 5,000 to 100,000, and particularly preferably 5,000 to 30,000. In a case where the weight-average molecular weight of the liquid crystal polymer is within the above-described range, in a film after heat treatment, thermal conductivity, heat resistance, strength, and rigidity in a thickness direction are excellent.

The content of resin is preferably 1% by mass to 100% by mass, and more preferably 10% by mass to 100% by mass, with respect to a total amount of resin layer.

The resin layer preferably contains a thermoplastic polymer, and more preferably contains a compound (hereinafter, referred to as "compound A") having a melting point lower than a melting point of thermoplastic polymer. Details of the compound A will be described below.

In the present disclosure, the melting point is a value that is calculated from a spectrum obtained by measurement of a differential scanning calorimeter.

The melting point of the thermoplastic polymer is preferably 0° C. to 500° C., and more preferably 20° C. to 400° C.

The melting point of the compound A is preferably 0° C. to 240° C., and more preferably 20° C. to 190° C.

A difference between the melting point of the thermoplastic polymer and the melting point of the compound A is preferably 10° C. to 250° C., and more preferably 30° C. to 200° C.

From a viewpoint of reducing a transmission loss, a dielectric loss tangent of the compound A is preferably equal to or less than 0.01, and more preferably equal to or less than 0.001.

The dielectric loss tangent of the compound A is measured by the following method.

The dielectric loss tangent is measured by a resonance perturbation method at a frequency of 28 GHz. Specifically, a polytetrafluoroethylene (PTFE) tube (outer diameter of 2.5 mm, inner diameter of 1.5 mm, length of 10 mm) filled with the compound A is inserted into a split cylinder resonator (manufactured by KANTO Electronic Application and Development Inc.) to which a network analyzer ("N5230A" manufactured by Keysight Technology Co., Ltd.) is connected, and the dielectric loss tangent is measured from change in resonance frequency before and after insertion using analysis software (manufactured by KANTO Electronic Application and Development Inc.). An influence of voids in the PTFE tube is corrected with Bruggeman Formula and a void ratio, whereby the dielectric loss tangent of the compound A is obtained. A calculation method of the void ratio is as follows.

A space volume in the PTFE tube is calculated from the inner diameter and the length of the PTFE tube. The weights before and after the PTFE tube is filled with a solid (powder) are measured, and a mass of the filled solid is calculated. A volume of the filled solid is calculated from the mass and specific gravity of the filled solid. The void ratio is calculated using the following expression.

Void Ratio (%)=100−(Volume of Filled Solid/Space Volume of PTFE Tube)×100

The measurement of the dielectric loss tangent of the compound A is performed using a sample made of powder of the compound A to be measured following the above-described measurement method of the dielectric loss tangent while specifying or isolating a chemical structure of the compound A.

The compound A may be particulate or may be fibrous. The compound A may be an inorganic compound or may be an organic compound.

Examples of a material of the inorganic compound include BN, $Al_2O_3$, AlN, $TiO_2$, $SiO_2$, barium titanate, strontium titanate, aluminum hydroxide, calcium carbonate, and a material containing two kinds or more thereof.

Examples of a material of the organic compound include polyethylene, polystyrene, urea-formalin filler, polyester, cellulose, acrylic resin, fluororesin, cured epoxy resin, cross-linked benzoguanamine resin, cross-linked acrylic resin, and a material containing two kinds or more thereof.

From a viewpoint of a bending property, the compound A is preferably the organic compound among the materials, and more preferably polyethylene or acrylic resin. The compound A may be a copolymer (for example, ethylene-acrylic acid copolymer) containing a constitutional unit derived from ethylene and a constitutional unit derived from acrylic acid.

In a case where the compound A is particulate, an average particle diameter is preferably 0.1 μm to 50 μm, and more preferably 1 μm to 20 μm. The average particle diameter means a 50% volume average diameter (D50: also referred to as a median particle diameter).

The content of the compound A is preferably 15% by mass to 90% by mass, and more preferably 30% by mass to 90% by mass, with respect to the total amount of the resin layer.

The resin layer may contain additives other than resin and the compound A.

As other additives, known additives can be used. Specifically, examples of the additives include a leveling agent, an antifoaming agent, an antioxidant, an ultraviolet absorbent, a flame retardant, and a colorant.

The resin layer may be a monolayer structure or may be a multilayer structure.

It is preferable that the resin layer includes a layer B disposed between the wiring patterns and on the wiring patterns, and a layer A disposed on the layer B.

A content of resin on the layer A is preferably equal to or greater than 80% by mass, and more preferably equal to or greater than 90% by mass, with respect to a total amount of the layer A. An upper limit value of the content of resin in the layer A is not particularly limited, and may be 100% by mass.

An average thickness of the layer A is not particularly limited, and is preferably 5 μm to 100 μm, more preferably 10 μm to 80 μm, and still more preferably 20 μm to 70 μm, from a viewpoint of improving wiring followability and further suppressing wiring distortion.

An average thickness of each layer in the wiring board according to the present disclosure is measured using the following method.

The wiring board is cut with a microtome, and a cross section is observed with an optical microscope to evaluate the thickness of each layer. A cross section sample is cut at three places or more, a thickness is measured at three points or more in each cross section, and an average value of the measured thicknesses is determined as an average thickness.

The layer A has an elastic modulus at 240° C. preferably equal to or greater than 300 MPa, and more preferably equal to or greater than 400 MPa, from a viewpoint of improving wiring followability and further suppressing wiring distortion. An upper limit value of the elastic modulus is not particularly limited, and is, for example, 9000 MPa.

The layer B has an elastic modulus at 140° C. of a region positioned between the wiring patterns preferably equal to or less than 0.1 MPa, and more preferably equal to or less than 0.08 MPa, from a viewpoint of improving wiring followability and further suppressing wiring distortion. A lower limit value of the elastic modulus is not particularly limited, and is, for example, 0.0001 MPa.

A content of resin in the layer B is preferably 10% by mass to 50% by mass, and more preferably 20% by mass to 40% by mass, with respect to a total amount of the layer B.

It is preferable that the layer B contains the above-described compound A.

A content of the compound A in the layer B is preferably 50% by mass to 90% by mass, and more preferably 60% by mass to 80% by mass, with respect to the total amount of the layer B.

On the other hand, a content of the compound A in the layer A is preferably less than 60% by mass, and more preferably less than 50% by mass, with respect to the total amount of the layer A from a viewpoint of improving wiring followability and further suppressing wiring distortion. In particular, it is preferable that the layer A does not contain the compound A.

An average thickness of the layer B is not particularly limited, and is preferably 5 μm to 50 μm, more preferably 10 μm to 40 μm, and still more preferably 20 μm to 30 μm, from a viewpoint of improving wiring followability and further suppressing wiring distortion.

In a case where the resin layer includes the layer A and the layer B, an interface between the layer A and the layer B can be confirmed with an optical microscope from a cross section sample of the resin layer cut with a microtome. In a case where it is hard to perform determination with the optical microscope, the interface can be confirmed through morphological observation with a scanning electron microscope (SEM). In a case where it is hard to perform determination with the scanning electron microscope (SEM), the interface can be confirmed through component analysis with time-of-flight secondary ion mass spectrometry (TOF-SIMS) or the like.

Examples of a method of providing the resin layer between the wiring patterns and on the wiring patterns include a method of superimposing a resin substrate on wiring patterns of a substrate with wiring patterns and heating the substrate with wiring patterns and the resin substrate in a superimposed state. A step of superimposing the resin substrate and a step of heating the substrate with wiring patterns and the resin substrate in the superimposed state will be described below.

A manufacturing method of the resin substrate is not particularly limited, and a known method can be referred to.

Suitable examples of the manufacturing method of the resin substrate include a co-casting method, a multilayer coating method, and a co-extrusion method. Among such methods, the co-casting method is particularly preferably used in producing a comparatively thin film, and the co-extrusion method is particularly preferably used in producing a thick film.

In a case of producing the films with the co-casting method and the multilayer coating method, it is preferable that the co-casting method or the multilayer coating method is performed using a composition for forming the layer A or a composition for forming the layer B in which the components of each layer, such as a polymer, are dissolved or dispersed in a solvent.

Example of the solvent include halogenated hydrocarbon, such as dichloromethane, chloroform, 1,1-dichloroethane, 1,2-dichloroethane, 1,1,2,2-tetrachloroethane, 1-chlorobutane, chlorobenzene, or o-dichlorobenzene; halogenated phenol, such as p-chlorophenol, pentachlorophenol, or pentafluorophenol; ether, such as diethyl ether, tetrahydrofuran, or 1,4-dioxane; ketone, such as acetone or cyclohexanone; ester, such as ethyl acetate or γ-butyrolactone; carbonate, such as ethylene carbonate or propylene carbonate; amine, such as triethylamine; a nitrogen-containing heterocyclic aromatic compound, such as pyridine; nitrile, such as acetonitrile or succinonitrile; amide, such as N,N-dimethylformamide, N,N-dimethylacetamide, or N-methylpyrrolidone; an urea compound, such as tetramethylurea; a nitro compound, such as nitromethane or nitrobenzene; a sulfur compound, such as dimethyl sulfoxide or sulfolane; and phosphorus compound, such as hexamethylphosphoramide or tri-n-butyl phosphate, and two kinds or more thereof may be used.

As the solvent, for low corrosiveness and easiness to handle, it is preferable that an aprotic compound (particularly preferably an aprotic compound having no halogen atom) is contained. A proportion of the aprotic compound to the whole solvent is preferably 50% by mass to 100% by mass, more preferably 70% by mass to 100% by mass, and particularly preferably 90% by mass to 100% by mass. As the above-described aprotic compound, for easiness to dissolve the liquid crystal polymer, a substance containing amide, such as N,N-dimethylformamide, N,N-dimethylacetamide, tetramethylurea or N-methylpyrrolidone, or ester, such as γ-butyrolactone, is preferably used, and N,N-dimethylformamide, N,N-dimethylacetamide, or N-methylpyrrolidone is more preferably used.

As the solvent, for easiness to dissolve the above-described polymer, such as a liquid crystal polymer, it is preferable that a compound having dipole moment of 3 to 5 is contained. A proportion of the compound having dipole moment of 3 to 5 to the while solvent is preferably 50% by mass to 100% by mass, more preferably 70% by mass to 100% by mass, and particularly preferably 90% by mass to 100% by mass.

It is preferable that the compound having dipole moment of 3 to 5 is used as the above-described aprotic compound.

As the solvent, for easiness to remove, it is preferable that a compound having a boiling point equal to or lower than 220° C. at one atmospheric pressure is contained. A proportion of the compound having a boiling point equal to or lower than 220° C. at one atmospheric pressure to the whole solvent is preferably 50% by mass to 100% by mass, more preferably 70% by mass to 100% by mass, and particularly preferably 90% by mass to 100% by mass.

It is preferable that the compound having a boiling point equal to or lower than 220° C. at one atmospheric pressure is used as the above-described aprotic compound.

In the manufacturing method of the resin substrate, in a case of manufacturing the resin substrate using the co-casting method, the multilayer coating method, and the co-extrusion method, a support may be used.

Examples of the support include a metal drum, a metal band, a glass plate, a resin film, and a metal foil. It is preferable that the support is a metal foil among the members.

Examples of the resin film include a polyimide (PI) film, and examples of a commercial product include U-pilex S and U-pilex R manufactured by Ube Industries, Ltd., KAPTON manufactured by Du Pont-Toray Co., Ltd., and IF30, IF70, and LV300 manufactured by SKCKOLON PI Inc.

A surface treatment layer may be formed on the surface of the support to be easily peelable. As the surface treatment layer, hard chrome plating, fluororesin, or the like can be used.

For example, in a case where the support is a metal foil, a polymer membrane can be formed by coating a polymer solution containing a polymer on the metal foil and drying the polymer solution. A resin substrate can be obtained by etching and removing the metal foil from the metal foil on which the polymer membrane is formed.

An average thickness of the support is not particularly limited, and is preferably equal to or greater than 25 µm and equal to or less than 75 µm, and more preferably equal to or greater than 50 µm and equal to or less than 75 µm.

A method of removing at least a part of the solvent from a casted or coated film-shaped composition (casted film or coated film) is not particularly limited, and a known drying method can be used.

With the above-described film production, a polymer membrane is obtained.

In the manufacturing method of the resin substrate, the polymer membrane may be stretched from a viewpoint of controlling a molecular orientation and adjusting a linear expansion coefficient and a mechanical property. A method of stretching is not particularly limited, a known method can be referred to, and stretching may be carried out in a state in which the solvent is contained or may be carried out in a state in which the film is dried. Stretching in a state in which the solvent is contained may be carried out by a method in which the resin substrate is gripped and expanded, may be carried out by a method using self-contractile force of a web with drying without expansion, or may be carried out by combining the methods. Stretching is particularly effective for a purpose of improving breaking elongation and breaking strength in a case where brittleness of the resin substrate is lowered due to addition of an inorganic filler or the like.

It is preferable that the manufacturing method of the resin substrate includes a step of performing heat treatment (annealing) on the polymer membrane.

Specifically, a heat treatment temperature in the step of performing the heat treatment is preferably 260° C. to 370° C., more preferably 280° C. to 360° C., and still more preferably 300° C. to 350° C., from a viewpoint of the dielectric loss tangent and peel strength. A heat treatment time is preferably 15 minutes to 10 hours, and more preferably 30 minutes to 5 hours.

The manufacturing method of the resin substrate may include other known steps as needed.

Substrate

A material of the substrate is not particularly limited, and preferably contains resin, preferably contains a liquid crystal polymer, and is more preferably a liquid crystal polymer film.

An average thickness of the substrate is not particularly limited, and is preferably 5 µm to 100 µm, more preferably 10 µm to 80 µm, and still more preferably 20 µm to 70 µm.

In the wiring board according to the present disclosure, the substrate has an elastic modulus at 240° C. preferably equal to or greater than 300 MPa, more preferably equal to or greater than 400 MPa, and still more preferably equal to or greater than 450 MPa, from a viewpoint of improving wiring followability and further suppressing wiring distortion. An upper limit value of the elastic modulus is not particularly limited, and is, for example, 9000 MPa.

A dielectric loss tangent of the substrate is preferably equal to or less than 0.006, and more preferably greater than 0 and equal to or less than 0.003.

Examples of the resin contained in the substrate include the same substances as resin contained in the above-described resin layer.

It is preferable that the substrate contains a liquid crystal polymer among the substances from a viewpoint of the dielectric loss tangent. A preferred aspect of the liquid crystal polymer that can be contained in the substrate is the same as the preferred aspect of the liquid crystal polymer that can be contained in the resin layer.

Manufacturing Method of Wiring Board

A manufacturing method of the wiring board according to the present disclosure includes a step of superimposing the resin substrate on the wiring patterns of the substrate with wiring patterns, and a step of heating the substrate with wiring patterns and the resin substrate in a superimposed state to obtain the wiring board. The resin substrate has an elastic modulus at a heating temperature in heating in the superimposed state equal to or less than 0.1 MPa in a region to a thickness position corresponding to a thickness of the wiring pattern with a surface on a side superimposed on the substrate with wiring patterns as a starting point, and a dielectric loss tangent of the wiring board is equal to or less than 0.006.

Superimposition Step

In the manufacturing method of the wiring board according to the present disclosure, the resin substrate is superimposed on the wiring patterns of the substrate with wiring patterns. The resin substrate is disposed on the wiring patterns in advance before the wiring patterns are buried in the heating step described below.

In a case of superimposing the resin substrate, the resin substrate may be just placed on the wiring patterns or the resin substrate may be pressure-welded onto the wiring patterns while applying pressure and pressing the resin substrate.

In the substrate with wiring patterns, the wiring patterns may be formed only on one surface of the substrate or the wiring patterns may be formed on both surfaces of the substrate.

The substrate with wiring patterns can be produced using a known method. For example, a metal layer is adhered to at least one surface of the substrate to obtain a laminate comprising the substrate and the metal layer disposed on at least one surface of the substrate. A known pattering treatment is performed on the metal layer, whereby the substrate with wiring patterns is obtained.

A preferred aspect of the substrate and the wiring patterns in the substrate with wiring patterns is the same as the preferred aspect of the substrate and the wiring pattern described in the section of the wiring board. A preferred aspect of the resin substrate is the same as the preferred aspect of the resin layer described in the section of the wiring board, except for a point described below.

The resin substrate is manufactured, for example, using the manufacturing method of the resin substrate that is used in providing the resin layer described in the section of the wiring board.

The resin substrate has an elastic modulus at a heating temperature in heating in the superimposed state equal to or less than 0.1 MPa, preferably equal to or less than 0.09 MPa, and more preferably equal to or less than 0.08 MPa in a region to a thickness position corresponding to the thickness of the wiring pattern with a surface of a side superimposed on the substrate with wiring patterns as a starting point. A measurement method of the elastic modulus is as described above.

The resin substrate has an elastic modulus at 25° C. preferably equal to or greater than 400 MPa in the region to the thickness position corresponding to the thickness of the wiring pattern with the surface on the side superimposed on the substrate with wiring patterns as a starting point, and more preferably equal to or greater than 450 MPa. A measurement method of the elastic modulus is as described above.

Heating Step

In the manufacturing method of the wiring board of the present disclosure, after the above-described superimposition step, the substrate with wiring patterns and the resin substrate are heated in the superimposed state to obtain a wiring board. In the obtained wiring board, the wiring patterns are buried between the substrate and the resin substrate.

A heating method is not particularly limited, and heating can be performed, for example, using a heat pressing machine.

The heating temperature in heating the substrate with wiring patterns and the resin substrate in the superimposed state is preferably 50° C. to 300° C., and more preferably 100° C. to 250° C.

It is preferable that the resin substrate contains a thermoplastic polymer. The above-described heating temperature is preferably a temperature lower than a melting point of the thermoplastic polymer, and more preferably a temperature lower than the melting point of the thermoplastic polymer by 10° C. or more, from a viewpoint of improving wiring followability and further suppressing wiring distortion. A measurement method of the melting point is as described above.

It is preferable that the resin substrate further contains a compound (that is, the compound A) having a melting point lower than the melting point of the thermoplastic polymer. The above-described heating temperature is preferably a temperature higher than the melting point of the compound A, and more preferably a temperature higher than the melting point of the compound A by 10° C. or more, from a viewpoint of improving wiring followability and further suppressing wiring distortion.

It is preferable that pressure is applied in heating the substrate with wiring patterns and the resin substrate in the superimposed state. The pressure is preferably 0.5 MPa to 30 MPa, and more preferably 1 MPa to 20 MPa.

The heating time in heating the substrate with wiring patterns and the resin substrate in the superimposed state is not particularly limited, and is, for example, one minute to two hours.

It is preferable that the resin substrate includes a layer A, and a layer B provided on at least one surface of the layer A. In the step of superimposing the resin substrate, it is preferable that the resin substrate is superimposed such that the layer B side is in contact with the substrate with wiring patterns.

The layer B has an elastic modulus at the above-described heating temperature preferably equal to or less than 0.1 MPa, more preferably equal to or less than 0.09 MPa, and still more preferably equal to or less than 0.08 MPa. A measurement method of the elastic modulus is as described above.

The layer A has an elastic modulus at the above-described heating temperature preferably equal to or greater than 300 MPa, and more preferably equal to or greater than 400 MPa. A measurement method of the elastic modulus is as described above.

A preferred aspect of the layer A and the layer B is the same as the preferred aspect of the layer A and the layer B described in the section of the wiring board described above.

Purposes

The wiring board according to the present disclosure can be used for various purposes. The wiring board according to the present disclosure can be suitably used in a flexible printed circuit board among the purposes.

EXAMPLES

The present disclosure will be further specifically described in connection with examples. Materials, used amounts, ratios, treatment contents, treatment procedures, and the like described in the following examples can be appropriately changed within a range without departing from the spirit and scope of the present disclosure. The scope of the present disclosure is not limited to the following specific examples.

The measurement of the melting point is performed by the method described above. Details of materials used in examples and comparative examples are as follows.

Polymer

LCP . . . Liquid crystal polymer produced following a manufacturing method described below PPS . . . poly(1,4-phenylenesulfide), melting point 290° C., manufactured by Sigma-Aldrich Inc.

PPE . . . poly(2,6-dimethyl-1,4-phenylene oxide), melting point 268° C., manufactured by Sigma-Aldrich Inc.

Manufacture of LCP 940.9 g (5.0 mol) of 6-hydroxy-2-naphthoic acid, 377.9 g (2.5 mol) of acetaminophen, 415.3 g (2.5 mol) of isophthalic acid, and 867.8 g (8.4 mol) of acetic anhydride are put in a reactor comprising a stirring device, a torque meter, a nitrogen gas introduction pipe, thermometer, and a reflux condenser, gas in the reactor is substituted with nitrogen gas, a temperature increases from a room temperature (23° C.) to 143° C. over 60 minutes while stirring under a nitrogen gas flow, and refluxing is performed for one hour at 143° C.

Next, the temperature increases from 150° C. to 300° C. over five hours while distilling by-produced acetic acid unreacted acetic anhydride and is maintained at 300° C. for 30 minutes, and then, a content is taken out from the reactor and is cooled to the room temperature. An obtained solid is ground by a grinder, and powdered liquid crystalline polyester (A1) is obtained.

The obtained liquid crystalline polyester (A1) is subjected to solid polymerization by increasing the temperature from the room temperature to 160° C. over two hours and 20 minutes, next increasing the temperature from 160° C. to 180° C. over three hours and 20 minutes, and maintaining the temperature at 180° C. for five hours under a nitrogen atmosphere, then, is cooled, and next, is ground by the grinder, and powdered liquid crystalline polyester (A2) is obtained.

The obtained liquid crystalline polyester (A2) is subjected to solid polymerization by increasing the temperature from the room temperature (23° C.) to 180° C. over one hour and 20 minutes, next, increasing the temperature from 180° C. to 240° C. over five hours, and maintaining the temperature at 240° C. for five hours under the nitrogen atmosphere, and then, is cooled, and powdered liquid crystalline polyester (LCP) is obtained.

Additive; Compound A

CL-2080 . . . Spherical low-density polyethylene (product name "Flow Beads CL-2080", median particle diameter 11 μm, melting point 105° C., density 0.92 g/cm$^3$, dielectric loss tangent 0.0007, manufactured by SUMITOMO SEIKA CHEMICALS CO., LTD.)

LE-1080 . . . Spherical low-density polyethylene (product name "Flow Beads LE-1080", median particle diameter 6 μm, melting point 105° C., density 0.92 g/cm$^3$, dielectric loss tangent 0.0007, manufactured by SUMITOMO SEIKA CHEMICALS CO., LTD.)

HE-3040 . . . Spherical high-density polyethylene (product name "Flow Beads HE-3040", median particle diameter 11 μm, melting point 130° C., density 0.96 g/cm$^3$, dielectric loss tangent 0.0008, manufactured by SUMITOMO SEIKA CHEMICALS CO., LTD.)

PM-200 . . . Spherical polyethylene (product name "MIPELON PM-200", average particle diameter 10 μm, melting point 110° C., density 0.94 g/cm$^3$, dielectric loss tangent 0.0004, manufactured by Mitsui Chemicals Co., Ltd.)

EA-209 . . . ethylene acrylic acid copolymer (product name "Flow Beads EA-209", median particle diameter 10 μm, melting point 101° C., density 0.94 g/cm$^3$, dielectric loss tangent 0.002, manufactured by SUMITOMO SEIKA CHEMICALS CO., LTD.)

F-1 . . . Mixture (mass ratio is CL-2080:polyimide powder=80:20) of CL-2080 described above and polyimide powder (ground product of product name "P84NT", dielectric loss tangent 0.02, manufactured by Daicel-Evonik Ltd.)

Example 1

Production of Substrate with Wiring Patterns

A copper foil (product name "CF-T4X-SV-18", average thickness 18 μm, manufactured by Fukuda Metal Foil & Powder Co., Ltd.) and a liquid crystal polymer film (product name "CTQ-50", average thickness 50 μm, manufactured by Kuraray Co., Ltd.) as a substrate are prepared. The copper foil, the substrate, the copper foil are superimposed in this order such that a treatment surface of the copper foil is in contact with the substrate. Laminate treatment for one minute is performed under conditions of 140° C. and laminate pressure 0.4 MPa using a laminator (product name "Vacuum Laminator V-130", manufactured by Nikko-Materials Co., Ltd.), and a precursor of a double-sided copper-clad laminate is obtained. Subsequently, the obtained copper-clad laminate precursor is thermocompression-bonded for ten minutes under conditions of 300° C. and 4.5 MPa using a thermocompression bonder (product name "MP-SNL", Toyo Seiki Seisaku-sho, Ltd.), whereby a double-sided copper-clad laminate is produced.

The copper foils on both surfaces of the above-described double-sided copper-clad laminate are patterned, and a substrate with wiring patterns including a ground line and three pairs of signal lines on both sides of the substrate is produced. A length of the signal line is 50 mm, and a width of the signal line is set such that characteristic impedance is 50Ω.

Production of Wiring Board 0.36 g of LCP and 4.19 g of N-methylpyrrolidone are heated at 90° C. for four hours, and are allowed to cool to the room temperature. 1.45 g of CL-2080 and 4 g of N-methylpyrrolidone (manufactured by FUJIFILM Wako Pure Chemical Corporation) are added and are sufficiently stirred, and a polymer solution B1 is obtained. The polymer solution B1 is coated on a copper foil (product name "CF-T9DA-SV-18", average thickness 18 μm, manufactured by Fukuda Metal Foil &Powder Co., Ltd.) using an applicator (clearance: 250 μm), and then, is dried at 50° C. for three hours, and a polymer membrane is obtained. The coating and drying of the polymer solution B1 are repeated six times, whereby a polymer membrane having a thickness of 75 μm is formed. After predrying at 120° C. for one hour is performed, annealing treatment is performed at 280° C. for three hours under a nitrogen atmosphere. With this, a laminate where the polymer membrane is formed on the copper foil is obtained. The laminate is immersed in an iron (III) chloride aqueous solution (solid content 40% by mass, manufactured by FUJIFILM Wako Pure Chemical Corporation) for one hour to etch the copper foil, and then, is washed with water. With this, a polymer film (resin substrate) is obtained. The polymer film, the substrate with wiring patterns, and the polymer film are laminated in this order such that the polymer films face the wiring pattern side of the substrate with wiring patterns (superimposition step), and heat press for one hour is performed under conditions of 160° C. and 4 MPa (heating step), whereby a wiring board having the same structure as in FIG. 2 is obtained.

In the obtained wiring board, the wiring patterns (ground line and signal lines) are buried, and a thickness of the wiring pattern is 18 μm.

Example 2

0.71 g of LCP and 8.22 g of N-methylpyrrolidone are heated at 90° C. for four hours, and are allowed to cool to the room temperature. 1.07 g of CL-2080 and 4 g of N-methylpyrrolidone (manufactured by FUJIFILM Wako Pure Chemical Corporation) are added and are sufficiently stirred, and a polymer solution B2 is obtained.

A wiring board is obtained with the same method as in Example 1 except that the polymer solution B1 is changed to the polymer solution B2.

Example 3

A mixture of LCP and N-methylpyrrolidone is heated at 90° C. for four hours, and then, is allowed to cool to the room temperature, and a polymer solution A1 is obtained. The polymer solution A1 is coated on a copper foil (product name "CF-T9DA-SV-18", average thickness 18 μm, manufactured by Fukuda Metal Foil &Powder Co., Ltd.) using the applicator (clearance: 250 μm), and then, is dried at 50° C. for three hours, and a polymer membrane is obtained. The coating and drying of the polymer solution A1 are repeated four times, whereby a polymer membrane (layer A) having a thickness of 50 μm is formed. The coating and drying of the polymer solution B1 obtained in the same manner as in Example 1 on the polymer membrane (layer A) are repeated two times, and a polymer membrane (layer B) having a film thickness of 25 μm is formed. After predrying at 120° C. for one hour is performed, annealing treatment is performed at 280° C. for three hours under a nitrogen atmosphere. With this, a laminate where the layer A and the layer B are formed on the copper foil is obtained.

A polymer film is obtained using the obtained laminate with the same method as in Example 1. The polymer film, the substrate with wiring patterns, and the polymer film are laminated in this order such that the layer B side of the obtained polymer film and the wiring pattern side the substrate with wiring patterns face each other, and a wiring board is obtained with the same method as in Example 1.

Example 4

A wiring board is obtained with the same method as in Example 3 except that the polymer solution B1 is changed to the polymer solution B2.

Example 5 to Example 8, Example 12

In Example 5, Example 7, Example 8, and Example 12, a wiring board is obtained with the same method as in Example 3 except that the additives contained in the polymer solution B1 are changed to additives described in Table 1.

In Example 6, a wiring board is obtained with the same method as in Example 3 except that the additives contained in the polymer solution B1 are changed to additives described in Table 1, and the temperature of heat press is changed to 180° C.

Example 9

0.8 g of PPS and 9.2 g pf dichloromethane (manufactured by FUJIFILM Wako Pure Chemical Corporation) are mixed and are sufficiently stirred, and a polymer solution A2 is obtained. 4.55 g of the polymer solution A2, 1.45 g of CL-2080, and 4 g of dichloromethane are mixed and are sufficiently stirred, and a polymer solution B3 is obtained.

A wiring board is obtained with the same method as in Example 3 except that the polymer solution A1 is changed to the polymer solution A2, and the polymer solution B1 is changed to the polymer solution B3.

Example 10

A wiring board is obtained with the same method as in Example 9 except that PPS is changed to PPE, and dichloromethane is changed to toluene (manufactured by FUJIFILM Wako Pure Chemical Corporation).

Example 11

0.28 g of LCP and 3.22 g of N-methylpyrrolidone are heated at 90° C. for four hours, and are allowed to cool to the room temperature. 2.5 g of CL-2080 and 4 g of N-methylpyrrolidone (manufactured by FUJIFILM Wako Pure Chemical Corporation) are added and are sufficiently stirred, and a polymer solution B4 is obtained.

A wiring board is obtained with the same method as in Example 1 except that the polymer solution B1 is changed to the polymer solution B4.

Comparative Example 1

0.76 g of LCP and 8.74 g of N-methylpyrrolidone are heated at 90° C. for four hours and are allowed to cool to the room temperature. 0.5 g of CL-2080 is added and is sufficiently stirred, and a polymer solution B5 is obtained.

A wiring board is obtained with the same method as in Example 3 except that the polymer solution B1 is changed to the polymer solution B5.

Comparative Example 2

0.79 g of LCP and 9.11 g of N-methylpyrrolidone are heated at 90° C. for four hours and are allowed to cool to the room temperature. 0.2 g of CL-2080 is added and is sufficiently stirred, and a polymer solution B6 is obtained.

A wiring board is obtained with the same method as in Example 3 except that the polymer solution B1 is changed to the polymer solution B6.

Comparative Example 3

A wiring board is obtained with the same method as in Example 1 except that the polymer solution B1 is changed to a mixture of 0.8 g of LCP and 9.2 g of N-methylpyrrolidone.

A dielectric loss tangent and an elastic modulus are measured using the obtained wiring boards. Specifically, in regard to the elastic modulus, elastic moduli at 25° C., 140° C., and the heating temperature of the region positioned between the wiring patterns and elastic moduli at 240° C. and the heating temperature of the layer A are measured. The heating temperature means a temperature in heating the substrate with wiring patterns and the resin substrate in the superimposed state and corresponds to the temperature of the above-described heat press.

Evaluation of wiring followability and wiring distortion is performed using the obtained wiring boards. A measurement method and an evaluation method are as follows.

Measurement

Dielectric Loss Tangent

The dielectric loss tangent is measured by a resonance perturbation method at a frequency of 28 GHz. Specifically, a split cylinder resonator (manufactured by KANTO Electronic Application and Development Inc.) is connected to a network analyzer ("N5230A" manufactured by Keysight Technology Co., Ltd.), a test piece (width: 25 mm×length: 50 mm, 24° C.·50%·24 hours humidity control) is inserted into a cavity resonator, and a dielectric loss tangent is measured from change in resonance frequency before and after insertion using analysis software manufactured by KANTO Electronic Application and Development Inc.

Elastic Modulus

First, the wiring board is cut with a microtome to obtain a cross section, and a region positioned between wiring patterns disposed in an in-plane direction of the same plane is specified from an image obtained by observing near wiring with an optical microscope. Next, an elastic modulus in the specified region is measured as an indentation elastic modulus using a nanoindentation method. The indentation elastic modulus is measured by setting a heating stage having heaters above and below a sample (the outside of the resin layer 60 and the resin layer 80) in a micro hardness tester (product name "DUH-W201", manufactured by Shimadzu Corporation), adjusting a heater temperature to a predetermined temperature, applying a load to the specified region at a loading rate of 0.28 mN/second with a Vickers indenter, maintaining a maximum load 10 mN for ten seconds, and then, performing unloading at a loading rate of 0.28 mN/second.

Evaluation

Wiring Followability

The wiring board is cut along the thickness direction with a microtome, and the cross section where the resin layer 60/the wiring patterns 50/the substrate 40/the wiring patterns 70/the resin layer 80 are laminated in this order is observed with an optical microscope. A length L of a gap that occurs in the in-plane direction of the cross section, between the resin layer 60 and the wiring pattern 50 is measured. An average value at ten places is calculated. An evaluation standard is as follows. "A" and "B" are evaluated as acceptable.

A: L is 0 µm.
B: L is greater than 0 µm and equal to or less than 4 µm.
C: L is greater than 4 µm and equal to or less than 20 µm.
D: L is greater than 20 µm.

Wiring Distortion

The wiring board is cut with a microtome, and a cross section is observed with an optical microscope. Wiring distortion is evaluated based on the presence or absence of distortion in the signal lines and the ground line. An evaluation standard is as follows. "A" and "B" are evaluated as acceptable.

A: No distortion is recognized in the signal lines and the ground line.
B: While distortion is recognized in the signal lines, no distortion is recognized in the ground line.
C: Distortion is recognized in a pair of signal lines.
D: Distortion is recognized in two pairs or three pairs of signal lines.

A measurement result and an evaluation result are shown in Table 1. In Table 1, in a field of an elastic modulus of the layer A, a value measured at 240° C. is described in an upper portion, and a value measured at the heating temperature is described in a lower portion. In a field of an elastic modulus of the region positioned between the wiring patterns, a value measured at 140° C. is described in an upper portion, and a value measured at the heating temperature is described in a lower portion.

TABLE 1

| | Layer A | | | | | | Layer B (Wiring Pattern Side) | | | | |
|---|---|---|---|---|---|---|---|---|---|---|---|
| | Polymer | | | | Elastic Modulus [MPa] 240° C., Heating Temperature | | Polymer | | | | |
| | Type | Melting Point [° C.] | Dielectric Loss Tangent | Thickness [μm] | Dielectric Loss Tangent | | Type | Melting Point [° C.] | Dielectric Loss Tangent | Ratio [% by mass] | Additive Type |
| Example 1 | | | — | | | — | LCP | 320 | 0.006 | 20 | CL-2080 |
| Example 2 | | | — | | | — | LCP | 320 | 0.006 | 40 | CL-2080 |
| Example 3 | LCP | 320 | 0.006 | 50 | 0.0057 | 450 / 930 | LCP | 320 | 0.006 | 20 | CL-2080 |
| Example 4 | LCP | 320 | 0,006 | 50 | 0.0057 | 450 / 930 | LCP | 320 | 0.006 | 40 | CL-2080 |
| Example 5 | LCP | 320 | 0.006 | 50 | 0.0057 | 450 / 930 | LCP | 320 | 0.006 | 20 | LE-1080 |
| Example 6 | LCP | 320 | 0.006 | 50 | 0.0057 | 450 / 930 | LCP | 320 | 0.006 | 20 | HE-3 040 |
| Example 7 | LCP | 320 | 0.006 | 50 | 0.0057 | 450 / 930 | LCP | 320 | 0.006 | 20 | PM-200 |
| Example 8 | LCP | 320 | 0.006 | 50 | 0.0057 | 450 / 930 | LCP | 320 | 0.006 | 20 | EA-209 |
| Example 9 | PPS | 290 | 0.003 | 50 | 0.0033 | 420 / 850 | PPS | 290 | 0.003 | 20 | CL-2080 |
| Example 10 | PPE | 268 | 0.003 | 50 | 0.0026 | 410 / 810 | PPE | 210 | 0.003 | 20 | CL-2080 |
| Example 11 | | | — | | | | LCP | 320 | 0.006 | 5 | CL-2080 |
| Example 12 | LCP | 320 | 0.006 | 50 | 0.0057 | 450 / 930 | LCP | 320 | 0.006 | 20 | F-1 |
| Comparative Example 1 | LCP | 320 | 0.006 | 50 | 0.0057 | 450 / 930 | LCP | 320 | 0.006 | 60 | CL-2080 |
| Comparative Example 2 | LCP | 320 | 0.006 | 50 | 0.0057 | 450 / 930 | LCP | 320 | 0.006 | 80 | CL-2080 |
| Comparative Example 3 | | | — | | | | LCP | 320 | 0.006 | 100 | — |

| | Layer B (Wiring Pattern Side) Additive | | | | | Region Positioned Between Wiring Patterns | | Wiring Board | Evaluation | |
|---|---|---|---|---|---|---|---|---|---|---|
| | | | | | | Elastic Modulus [MPa] 140° C., 25° C. | Heating Temperature [° C.] | Dielectric Loss Tangent | | |
| | Melting Point [° C.] | Dielectric Loss Tangent | Ratio [% by mass] | Thickness [μm] | Dielectric Loss Tangent | Heating Temperature / Elastic Modulus [MPa] | | | Wiring Followability | Wiring Distortion |
| Example 1 | 105 | 0.0007 | 80 | 75 | 0.002 | 0.04 / 0.03 | 600 | 160 | 0.002 | A | A |
| Example 2 | 105 | 0.0007 | 60 | 75 | 0.003 | 0.06 / 0.05 | 1000 | 160 | 0.003 | A | A |
| Example 3 | 105 | 0.0007 | 80 | 25 | 0.002 | 0.04 / 0.03 | 600 | 160 | 0.004 | A | A |
| Example 4 | 105 | 0.0007 | 60 | 25 | 0.003 | 0.06 / 0.05 | 1000 | 160 | 0.005 | A | A |
| Example 5 | 105 | 0.0007 | 80 | 25 | 0.002 | 0.04 / 0.03 | 600 | 160 | 0.004 | A | A |
| Example 6 | 130 | 0.0007 | 80 | 25 | 0.002 | 0.08 / 0.06 | 720 | 180 | 0.005 | B | A |

TABLE 1-continued

| | | | | | | | | | | | |
|---|---|---|---|---|---|---|---|---|---|---|---|
| Example 7 | 110 | 0.0007 | 80 | 25 | 0.002 | 0.05<br>0.04 | 640 | 160 | 0.005 | A | A |
| Example 8 | 101 | 0.0007 | 80 | 25 | 0.003 | 0.06<br>0.05 | 660 | 160 | 0.005 | A | A |
| Example 9 | 105 | 0.0007 | 80 | 25 | 0.001 | 0.07<br>0.06 | 820 | 160 | 0.003 | A | A |
| Example 10 | 105 | 0.0007 | 80 | 25 | 0.001 | 0.09<br>0.08 | 860 | 160 | 0.002 | B | A |
| Example 11 | 105 | 0.0007 | 95 | 75 | 0.001 | 0.03<br>0.02 | 300 | 160 | 0.001 | A | B |
| Example 12 | 105 | 0.02 | 80 | 75 | 0.005 | 0.1 | 700 | 160 | 0.003 | B | A |
| Comparative Example 1 | 105 | 0.0007 | 40 | 25 | 0.004 | 0.2<br>0.15 | 1500 | 160 | 0.005 | D | A |
| Comparative Example 2 | 105 | 0.0007 | 20 | 25 | 0.005 | 1<br>0.8 | 2000 | 160 | 0.005 | D | A |
| Comparative Example 3 | — | | | 75 | 0.006 | 10<br>8 | 4000 | 160 | 0.006 | D | A |

As shown in Table 1, in Example 1 to Example 12, it is understood that, since the wiring patterns are buried, the region positioned between the wiring patterns disposed in the in-plane direction of the same plane has the elastic modulus at 140° C. equal to or less than 0.1 MPa, and the dielectric loss tangent of the wiring board is equal to or less than 0.006, wiring followability is excellent, and wiring distortion is suppressed.

On the other hand, in Comparative Example 1 to Comparative Example 3, it is understood that, since the region positioned between the wiring patterns disposed in the in-plane direction of the same plane has the elastic modulus at 140° C. greater than 0.1 MPa, it is not possible to achieve both wiring followability and suppression of wiring distortion.

EXPLANATION OF REFERENCES 100, 200 . . . wiring board
10, 40 . . . substrate
20, 50, 70 . . . wiring pattern
30, 60, 80 . . . resin layer

What is claimed is:

1. A wiring board, comprising:
    a substrate;
    first wiring patterns disposed on a first surface of the substrate;
    a first resin layer containing a thermoplastic polymer disposed between the first wiring patterns and on the first wiring patterns;
    second wiring patterns disposed on a second surface of the substrate opposite to the first surface; and
    a second resin layer disposed between the second wiring patterns and on the second wiring patterns,
    wherein a first region positioned between the first wiring patterns disposed in a first in-plane direction of the same plane and a second region positioned between the second wiring patterns disposed in a second in-plane direction of the same plane each have an elastic modulus at 140° C. equal to or less than 0.1 MPa, and a dielectric loss tangent is equal to or less than 0.006;
    wherein the first resin layer further contains a compound having a melting point lower than a melting point of the thermoplastic polymer.

2. The wiring board according to claim 1, wherein a thickness of the first wiring pattern is 5 μm to 40 μm.

3. The wiring board according to claim 1, wherein the first region has an elastic modulus at 25° C. equal to or greater than 400 MPa.

4. The wiring board according to claim 1, wherein the thermoplastic polymer is a liquid crystal polymer.

5. The wiring board according to claim 4, wherein the liquid crystal polymer has a constitutional unit represented by any of Formula (1) to Formula (3),

—O—Ar¹—CO—                                Formula (1)

—CO—Ar²—CO—                              Formula (2)

—X—Ar³—Y—                                  Formula (3)

in Formula (1) to Formula (3), Ar¹ represents a phenylene group, a naphthylene group, or a biphenylylene group, Ar² and Ar³ each independently represent a phenylene group, a naphthylene group, a biphenylylene group, or a group represented by Formula (4), X and Y each independently represent an oxygen atom or an imino group, and at least one of hydrogen atoms in Ar¹ to Ar³ may be each independently substituted with a halogen atom, an alkyl group, or an aryl group, and

—Ar⁴—Z—Ar⁵—                                Formula (4)

in Formula (4), Ar⁴ and Ar⁵ each independently represent a phenylene group or a naphthylene group, and Z represents an oxygen atom, a sulfur atom, a carbonyl group, a sulfonyl group, or an alkylene group.

6. The wiring board according to claim 1, wherein the compound has a dielectric loss tangent equal to or less than 0.01.

7. The wiring board according to claim 1, wherein a content of the compound is 15% by mass to 90% by mass with respect to a total amount of the first resin layer.

8. The wiring board according to claim 1,
    wherein the first resin layer includes a layer B disposed between the first wiring patterns and on the first wiring patterns, and a layer A disposed on the layer B, and
    the layer B has an elastic modulus at 140° C. equal to or less than 0.1 MPa in a region positioned between the first wiring patterns.

9. The wiring board according to claim 8, wherein the layer A has an elastic modulus at 240° C. equal to or greater than 300 MPa.

10. A method for manufacturing a wiring board, the method comprising:
    providing a substrate having a first surface and a second surface opposite to the first surface, wherein first wiring patterns and second wiring patterns are respectively disposed on the first surface and the second surface of the substrate;

superimposing a first resin substrate containing a thermoplastic polymer on the first wiring patterns of the substrate;

superimposing a second resin substrate on the second wiring patterns of the substrate; and heating the substrate, the first resin substrate, and the second resin substrate in a superimposed state to obtain a wiring board having the first wiring patterns and the second wiring patterns buried therein, wherein the first resin substrate positioned between the first wiring patterns disposed in a first in-plane direction of the same plane has an elastic modulus at a heating temperature of 140° C. in heating in the superimposed state equal to or less than 0.1 MPa in a first region to a first thickness position corresponding to a thickness of the first wiring pattern with a surface on a side superimposed on the substrate as a first starting point, the second resin substrate positioned between the second wiring patterns disposed in a second in-plane direction of the same plane has an elastic modulus at a heating temperature of 140° C. in heating in the superimposed state equal to or less than 0.1 MPa in a second region to a second thickness position corresponding to a thickness of the second wiring pattern with a surface on a side superimposed on the substrate as a second starting point, and a dielectric loss tangent of the wiring board is equal to or less than 0.006;

wherein the first resin substrate further contains a compound having a melting point lower than a melting point of the thermoplastic polymer.

11. The method for manufacturing a wiring board according to claim 10,
wherein the first resin substrate has an elastic modulus at 25° C. equal to or greater than 400 MPa in the region.

12. The method for manufacturing a wiring board according to claim 10, wherein the heating temperature in heating in the superimposed state is a temperature lower than a melting point of the thermoplastic polymer.

13. The method for manufacturing a wiring board according to claim 12 wherein the heating temperature in heating in the superimposed state is a temperature higher than the melting point of the compound.

14. The method for manufacturing a wiring board according to claim 10,
wherein the first resin substrate includes a layer A, and a layer B provided on at least one surface of the layer A,
the layer B has an elastic modulus at the heating temperature in heating in the superimposed state equal to or less than 0.1 MPa, and
in superimposing the first resin substrate, the first resin substrate is superimposed such that a layer B side is in contact with the substrate.

15. The method for manufacturing a wiring board according to claim 14,
wherein the layer A has an elastic modulus at the heating temperature in heating in the superimposed state equal to or greater than 300 MPa.

* * * * *